United States Patent
Bhuyan et al.

(10) Patent No.: US 9,234,274 B2
(45) Date of Patent: Jan. 12, 2016

(54) METHOD OF ATOMIC LAYER DEPOSITION OF ELEMENTAL METAL

(71) Applicant: Applied Materials, Inc., Santa Clara, CA (US)

(72) Inventors: Bhaskar Jyoti Bhuyan, Mumbai (IN); Anshita Gairola, Mumbai (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/074,294

(22) Filed: Nov. 7, 2013

(65) Prior Publication Data

US 2015/0125605 A1    May 7, 2015

Related U.S. Application Data

(60) Provisional application No. 61/724,046, filed on Nov. 8, 2012.

(51) Int. Cl.
*C23C 16/18*     (2006.01)
*C23C 16/455*    (2006.01)

(52) U.S. Cl.
CPC ............ *C23C 16/18* (2013.01); *C23C 16/45553* (2013.01)

(58) Field of Classification Search
None
See application file for complete search history.

(56) References Cited

U.S. PATENT DOCUMENTS

| 8,048,484 B2 | 11/2011 | Rahtu |
| 2003/0201541 A1* | 10/2003 | Kim .............................. 257/766 |
| 2005/0244672 A1* | 11/2005 | Che et al. ..................... 428/690 |
| 2011/0120875 A1 | 5/2011 | Norman |

OTHER PUBLICATIONS

Kim, Tae et al., "Convenient Synthesis of 1-Alkyl-2, 5-bis(thiophenylmethylene)pyrroles using the Mannich reaction", *Tetrahedron Letters* 39 1987, 1087-1090.
Yang, Lanying et al., "Self-Assembly of Bis(pyrrol-2-ylmethyleneamine) Ligands with $Cu^{II}$ Controlled by Bridging $[-(CH_2)_n-]$ Spacers and Weak Intermolecular C-H···Cu Hydrogen Bonding", *Eur. J. Inorg. Chem* 2004, 1478-1487.

* cited by examiner

*Primary Examiner* — Joseph Miller, Jr.
(74) *Attorney, Agent, or Firm* — Servilla Whitney LLC

(57) ABSTRACT

Methods for deposition of elemental metal films on surfaces using metal coordination complexes are provided. The metal complexes comprise thiophene, pyrrole or salen-based ligands. A substrate surface may be contacted with a vapor phase metal coordination complex such that a layer is formed on the surface comprising the metal coordination complex bound to the surface by the metal. The bound metal complex may then be contacted with a reducing gas such that an exchange reaction occurs between the bound metal coordination complex and the reducing gas, thereby dissociating the bound metal complex and producing a first layer of elemental metal on the surface of the substrate. The process can be repeated for additional layers.

5 Claims, No Drawings

METHOD OF ATOMIC LAYER DEPOSITION OF ELEMENTAL METAL

CROSS-REFERENCE TO RELATED APPLICATIONS

This application claims priority to U.S. Provisional Application No. 61/724,046, filed Nov. 8, 2012, the entire contents of which are herein incorporated by reference.

TECHNICAL FIELD

The present invention relates generally to methods of depositing thin films of elemental metal and to metal coordination complexes useful in such methods. In particular, the invention relates to the use of coordination complexes as precursors for pure or elemental metal in an atomic layer deposition process.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. One method for deposition of thin films with atomic layer control and conformal deposition is atomic layer deposition (ALD), which employs sequential, self-limiting surface reactions to form layers of precise thickness controlled at the Angstrom or monolayer level. Most ALD processes are based on binary reaction sequences which deposit a binary compound film. Each of the two surface reactions occurs sequentially, and because they are self-limiting, a thin film can be deposited with atomic level control. Because the surface reactions are sequential, the two gas phase reactants are not in contact, and possible gas phase reactions that may form and deposit particles are limited. The self-limiting nature of the surface reactions also allows the reaction to be driven to completion during every reaction cycle, resulting in films that are continuous and pinhole-free.

ALD has been used to deposit metals and metal compounds on substrate surfaces. $Al_2O_3$ deposition is an example of a typical ALD process illustrating the sequential and self-limiting reactions characteristic of ALD. $Al_2O_3$ ALD conventionally uses trimethylaluminum (TMA, often referred to as reaction "A" or the "A" precursor) and $H_2O$ (often referred to as the "B" reaction or the "B" precursor). In step A of the binary reaction, hydroxyl surface species react with vapor phase TMA to produce surface-bound $AlOAl(CH_3)_2$ and $CH_4$ in the gas phase. This reaction is self-limited by the number of reactive sites on the surface. In step B of the binary reaction, $AlCH_3$ of the surface-bound compound reacts with vapor phase $H_2O$ to produce AlOH bound to the surface and $CH_4$ in the gas phase. This reaction is self-limited by the finite number of available reactive sites on surface-bound $AlOAl(CH_3)_2$. Subsequent cycles of A and B, purging gas phase reaction products and unreacted vapor phase precursors between reactions and between reaction cycles, produces $Al_2O_3$ growth in an essentially linear fashion to obtain the desired film thickness.

While perfectly saturated monolayers are often desired, this goal is very difficult to achieve in practice. The typical approach to further ALD development has been to determine whether or not currently available chemistries are suitable for ALD. Prior art processes for ALD have been most effective for deposition of metal oxide and metal nitride films. Although a few processes have been developed that are effective for deposition of some late transition metals, ALD processes for deposition of pure metal have generally not been sufficiently successful to be adopted commercially. There is a need for new deposition chemistries that are commercially available, particularly in the area of elemental metal films. The present invention addresses this problem by providing novel chemistries which are specifically designed and optimized to take advantage of the atomic layer deposition process. In fact, before the present invention, there were no commercially available atomic layer deposition precursors that are capable of producing thin films of many elemental metals. For example, there are known methods of depositing thin manganese metal films via physical deposition methods in back end of the line processes. However, the thin metal films deposited this way have been shown to migrate to $SiO_2$ interfaces. This forms manganese oxide, which acts as a barrier layer and prevents copper diffusion. Better precursors and processes for the ALD of many elemental metals are desired.

SUMMARY

Provided are methods of atomic layer deposition of elemental or pure metal using metal coordination complexes. One aspect of the invention relates to a method of depositing elemental metal by atomic layer deposition, the method comprising contacting a surface of a substrate with a vapor phase metal coordination complex having the formula $MX_2$, wherein M is a transition metal and X is a thiophene-based ligand, such that a layer is formed on the surface comprising the metal coordination complex bound to the surface by the metal; and contacting the bound metal complex with a reducing gas such that an exchange reaction occurs between the bound metal coordination complex and the reducing gas, thereby dissociating the bound metal complex and producing a first layer of elemental metal on the surface of the substrate. The reducing gas may be hydrogen in one or more variants.

In one or more embodiments of this aspect, the metal coordination complex has a structure represented by:

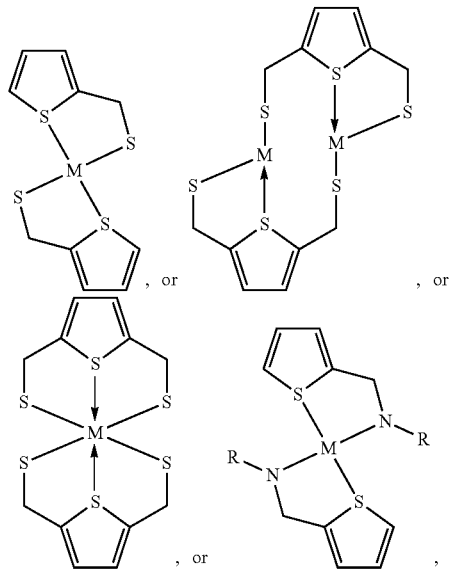

wherein M is a transition metal, and R is an alkyl group. Any one of these complexes may be used, or combinations thereof.

In another embodiment, M comprises nickel, manganese, cobalt, copper, ruthenium or combinations thereof. In yet another embodiment, the method further comprises purging excess unreacted vapor phase metal complex with an inert gas prior to addition of the reducing gas.

As used herein, "elemental metal" film or "pure metal" film refers to a film that consists essentially of a given metal. In one or more embodiments, there may be some minor levels of impurities in the film.

As used herein, "transition metal" refers to an element of Groups 3-12 of the periodic table. In some embodiments, the term includes lanthanides and actinides.

Additional layers can be added. Thus, in one variant of this aspect, the method further comprises contacting the first layer of elemental metal on the substrate surface with the vapor phrase metal coordination complex such that an exchange reaction occurs between the metal complex and the first layer of elemental metal, thereby partially dissociating the metal complex and producing a second layer on the surface comprising the partially dissociated metal complex bound to the first elemental metal layer by metal; and contacting the bound metal complex of the second layer with a reducing gas such that an exchange reaction occurs between the bound metal complex and the reducing gas, thereby dissociating the bound metal complex and producing a second layer of elemental metal on the surface of the substrate.

A second aspect of the invention relates to a method of depositing elemental metal by atomic layer deposition, the method comprising: contacting a surface of a substrate with a vapor phase metal coordination complex wherein the metal coordination complex has a structure represented by:

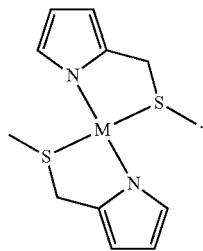

wherein M is a transition metal, such that a layer is formed on the surface comprising the metal coordination complex bound to the surface by the metal; and contacting the bound metal complex with a reducing gas such that an exchange reaction occurs between the bound metal coordination complex and the reducing gas, thereby dissociating the bound metal complex and producing a first layer of elemental metal on the surface of the substrate. In a particular embodiment, M comprises nickel, manganese, cobalt, copper, ruthenium or combinations thereof. Various features of the process can be varied. For example, in one embodiment, the reducing gas comprises hydrogen. In another embodiment, the vapor phase metal complex is in a mixture with an inert gas.

Additional layers can be added. Thus, in one embodiment of this aspect, the method further comprises contacting the first layer of elemental metal on the substrate surface with the vapor phrase metal coordination complex such that an exchange reaction occurs between the metal complex and the first layer of elemental metal, thereby partially dissociating the metal complex and producing a second layer on the surface comprising the partially dissociated metal complex bound to the first elemental metal layer by metal; and contacting the bound metal complex of the second layer with a reducing gas such that an exchange reaction occurs between the bound metal complex and the reducing gas, thereby dissociating the bound metal complex and producing a second layer of elemental metal on the surface of the substrate.

A third aspect of the invention relates to a method of depositing manganese metal by atomic layer deposition, the method comprising: contacting a surface of a substrate with a vapor phase metal coordination complex wherein the metal coordination complex has a structure represented by:

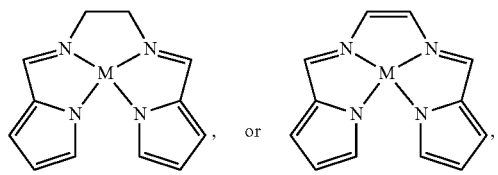

wherein M is a transition metal, such that a layer is formed on the surface comprising the metal coordination complex bound to the surface by the metal; and contacting the bound metal complex with a reducing gas such that an exchange reaction occurs between the bound metal coordination complex and the reducing gas, thereby dissociating the bound metal complex and producing a first layer of elemental metal on the surface of the substrate. Any one of these complexes may be used, or combinations thereof. In a specific embodiment, M comprises nickel, manganese, cobalt, copper, ruthenium or combinations thereof. In another embodiment, the reducing gas comprises hydrogen. In yet another embodiment, the method further comprises further comprising purging excess unreacted vapor phase metal complex with an inert gas prior to addition of the reducing gas.

Again, additional layers of metal may be added. In such cases, the method further comprises contacting the first layer of elemental metal on the substrate surface with the vapor phrase metal coordination complex such that an exchange reaction occurs between the metal complex and the first layer of elemental metal, thereby partially dissociating the metal complex and producing a second layer on the surface comprising the partially dissociated metal complex bound to the first elemental metal layer by metal; and contacting the bound metal complex of the second layer with a reducing gas such that an exchange reaction occurs between the bound metal complex and the reducing gas, thereby dissociating the bound metal complex and producing a second layer of elemental metal on the surface of the substrate.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formulae.

The term "metal coordination complex" as used herein is used interchangeably with "metal complex" and "coordination complex," and includes structures that consist of a central metal atom bonded to one or more ligands.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing steps disclosed may also be performed on an underlayer formed on the substrate as disclosed in more detail below, and the term "substrate surface" is intended to include such underlayer as the context indicates.

One aspect of the invention relates to a ligand useful for forming the metal coordination complex may be a member of one of three groups of structurally related compounds, represented by the formula $MX_2$, wherein M is a transition metal and X is a thiophene-based ligand. A first such group of ligands may be represented by formula (I):

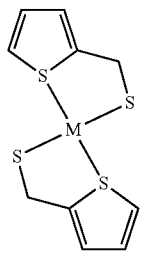

wherein M is a transition metal. These metal coordination complexes may be synthesized according to the following chemical schematic I:

Schematic I: Synthesis of Metal Coordination Complex of Formula (I):

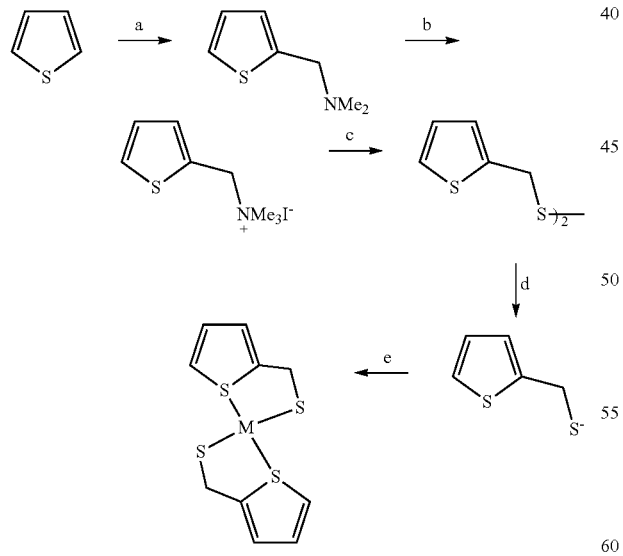

The reagents in schematic I are as follows: (a) is HCHO and NHMe$_2$, (b) is MeI, (c) is Na$_2$S$_2$, (d) is NaBH$_4$ and (e) is a metal salt of the desired transition metal.

A second such group of ligands is a tridentate ligand of a thiophene-based compound. As an example, the second group of ligands may be represented by formula (IIa):

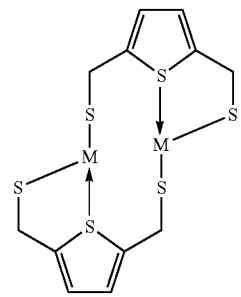

or formula (IIb):

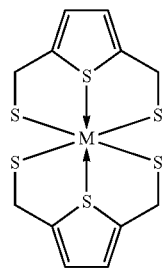

wherein M is a transition metal. The exact coordination of the ligands to the metal center will depend on the coordination sphere and valency of the metal center. For example, divalent 3d transition metals having a smaller coordination sphere will likely coordinate in a square planner or tetrahedral geometry (i.e., the structure represented by formula (IIa) with a solvent molecule) and metals having larger coordination sphere will likely have the structure represented by formula (IIb). An example of the synthesis of these coordination complexes is as follows in schematic II:

Schematic II: Synthesis of Metal Coordination Complex of Formula (II):

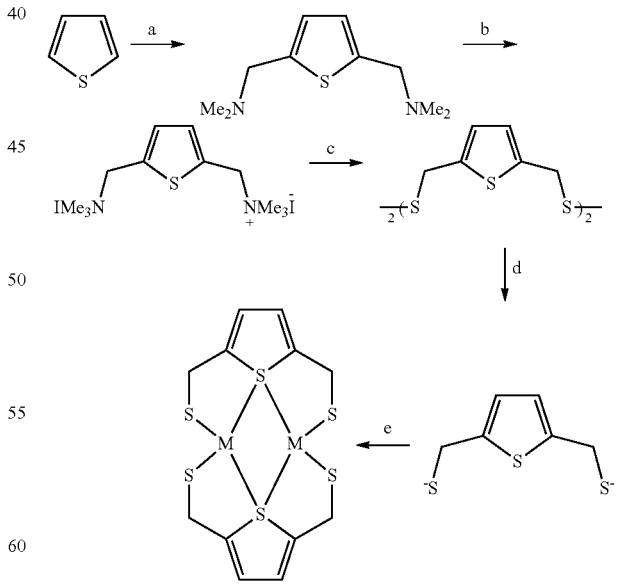

The reagents in schematic II are the same as those in schematic I, and are as follows: (a) is HCHO and NHMe$_2$, (b) is MeI, (c) is Na$_2$S$_2$, (d) is NaBH$_4$ and (e) is a metal salt of the desired transition metal.

A third such group of ligands may comprise a nitrogen atom in an N-alkyl 2-amino methyl thiophene ligand, and can be represented by formula (III):

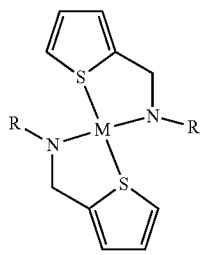

wherein M is a transition metal, and R is any alkyl group. Appropriate groups include, but are not limited to methyl, ethyl, isopropyl, tert-butyl etc. In one embodiment, R is any C1-C5 alkyl group. The ligand can be synthesized by controlling the stoichiometry of the reactants given in schematic II.

The ligands according to formulae (I)-(III) are useful in the deposition of elemental or pure metal films via atomic layer deposition. Accordingly, this aspect of the invention relates to a method of depositing elemental metal by atomic layer deposition. The method comprises contacting a surface of a substrate with a vapor phase metal coordination complex having the formula $MX_2$, wherein M is a transition metal and X is a thiophene-based ligand, such that a layer is formed on the surface comprising the metal coordination complex bound to the surface by the metal, and contacting the bound metal complex with a reducing gas such that an exchange reaction occurs between the bound metal coordination complex and the reducing gas, thereby dissociating the bound metal complex and producing a first layer of elemental metal on the surface of the substrate.

In specific embodiments, the coordination complex may have structures represented by formulae (I)-(III). Thus, in such specific embodiments, the metal coordination complex has a structure represented by:

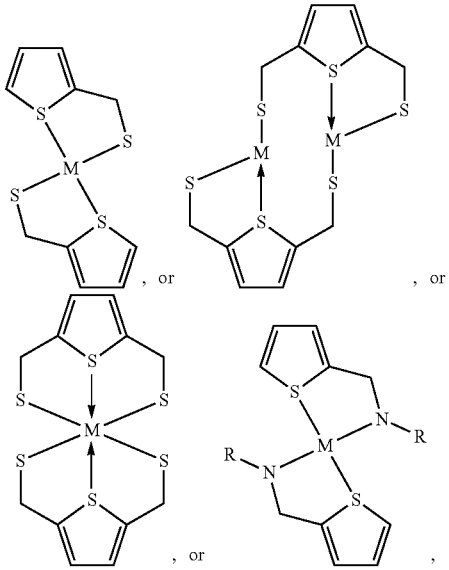

wherein M is a transition metal, and R is an alkyl group. Suitable examples include, but are not limited to, methyl, ethyl, isopropyl, tert-butyl etc. In one embodiment, R is any C1-C5 alkyl group. According to various embodiments, any one of the above coordination complexes individually may be used. Alternatively, more than one may be used.

In a particular embodiment, the method of this aspect may further comprise purging excess unreacted vapor phase metal complex with an inert gas prior to addition of the reducing gas. The method may also comprise contacting the first layer of elemental metal on the substrate surface with the vapor phrase metal coordination complex such that an exchange reaction occurs between the metal complex and the first layer of elemental metal, thereby partially dissociating the metal complex and producing a second layer on the surface comprising the partially dissociated metal complex bound to the first elemental metal layer by metal; and contacting the bound metal complex of the second layer with a reducing gas such that an exchange reaction occurs between the bound metal complex and the reducing gas, thereby dissociating the bound metal complex and producing a second layer of elemental metal on the surface of the substrate.

A second aspect of the invention relates to a pyrrole-based sulphide-containing ligand. The resulting metal coordination complex thus has a formula (IV), which may be represented by:

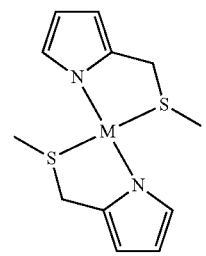

wherein M is a transition metal. The structure of formula (IV) may be obtained by the synthesis according to chemical schematic III:

Schematic III: Synthesis of Metal Coordination Complex of Formula (IV):

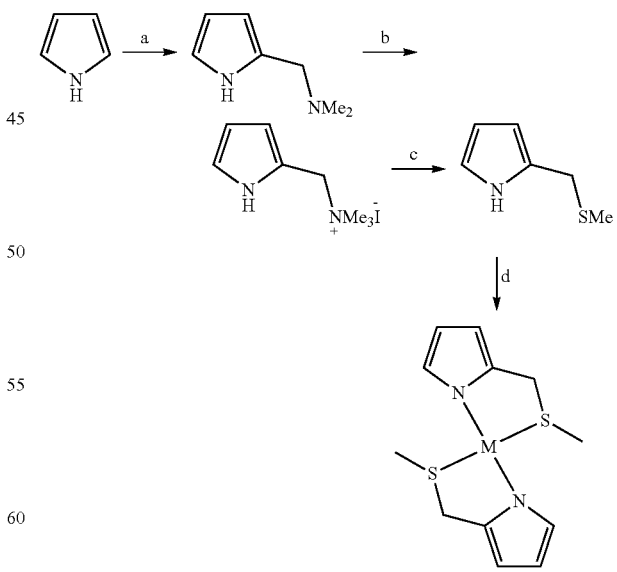

The reagents in schematic III are the same as those in schematic I, and are as follows: (a) is HCHO and $NHMe_2$, (b) is MeI, (c) is $MeS^-$, and (d) is a metal salt of the desired transition metal.

Accordingly, this aspect also relates to a method of depositing elemental metal by atomic layer deposition. The method comprises contacting a surface of a substrate with a vapor phase metal coordination complex wherein the metal coordination complex has a structure represented by formula (IV):

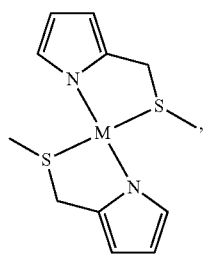

wherein M is a transition metal, such that a layer is formed on the surface comprising the metal coordination complex bound to the surface by the metal, and contacting the bound metal complex with a reducing gas such that an exchange reaction occurs between the bound metal coordination complex and the reducing gas, thereby dissociating the bound metal complex and producing a first layer of elemental metal on the surface of the substrate. In some embodiments, M may also be a lanthanide. It is also possible to complex lanthanides by schematic III by using the appropriate combination of metal salt and stoichiometry of the ligand.

In a particular embodiment, the metal complex of formula (IV) comprises nickel, manganese, cobalt, copper, ruthenium or combinations thereof. In another particular embodiment, the method further comprises purging excess unreacted vapor phase metal complex with an inert gas prior to addition of the reducing gas. In yet another particular embodiment, the vapor phase metal complex is in a mixture with an inert gas.

Additional layers may be deposited. Accordingly, in one embodiment, the method further comprises contacting the first layer of elemental metal on the substrate surface with the vapor phrase metal coordination complex such that an exchange reaction occurs between the metal complex and the first layer of elemental metal, thereby partially dissociating the metal complex and producing a second layer on the surface comprising the partially dissociated metal complex bound to the first elemental metal layer by metal; and contacting the bound metal complex of the second layer with a reducing gas such that an exchange reaction occurs between the bound metal complex and the reducing gas, thereby dissociating the bound metal complex and producing a second layer of elemental metal on the surface of the substrate.

A third aspect of the invention relates to salen-based ligands. The metal coordination complexes may have structures according to formula (V):

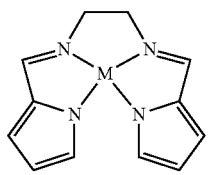

or formula (VI):

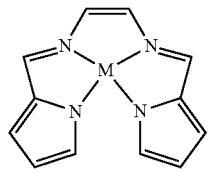

wherein M is a transition metal. These metal coordination complexes may be synthesized according to the following chemical schematic IV:

Schematic IV: Synthesis of Metal Coordination Complex of Formula (V):

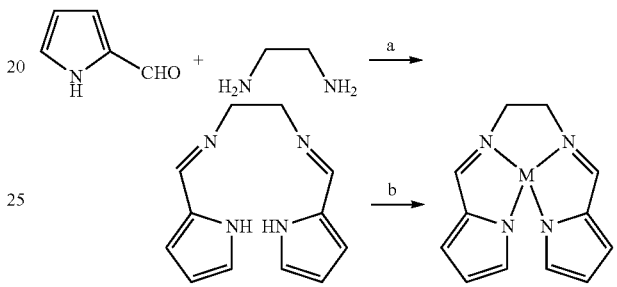

The reagents in schematic V are as follows: "a" is a solvent (e.g., ethanol), and "b" is the metal salt. An example of a suitable metal salt for copper is $CuCl_2$.

Accordingly, this aspect also relates to a method of depositing elemental metal by atomic layer deposition. The method comprises contacting a surface of a substrate with a vapor phase metal coordination complex wherein the metal coordination complex has a structure represented by:

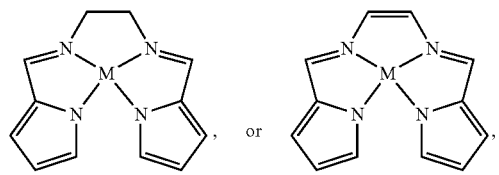

wherein M is a transition metal, such that a layer is formed on the surface comprising the metal coordination complex bound to the surface by the metal, and contacting the bound metal complex with a reducing gas such that an exchange reaction occurs between the bound metal coordination complex and the reducing gas, thereby dissociating the bound metal complex and producing a first layer of elemental metal on the surface of the substrate.

In one embodiment, the metal comprises nickel, manganese, cobalt, copper, ruthenium, or combinations thereof. In another embodiment, the reducing gas comprises hydrogen. In yet another embodiment, the method further comprises purging excess unreacted vapor phase metal complex with an inert gas prior to the addition of the reducing gas.

Additional layers may be deposited. Accordingly, the method may further comprise, in one or more embodiments, contacting the first layer of elemental metal on the substrate surface with the vapor phrase metal coordination complex such that an exchange reaction occurs between the metal complex and the first layer of elemental metal, thereby partially dissociating the metal complex and producing a second layer on the surface comprising the partially dissociated metal complex bound to the first elemental metal layer by metal; and contacting the bound metal complex of the second layer with a reducing gas such that an exchange reaction occurs between the bound metal complex and the reducing gas, thereby dissociating the bound metal complex and producing a second layer of elemental metal on the surface of the substrate.

Generally, the transition metals that can be used in accordance with one or more embodiments of one or more aspects of the invention are quite broad. In a particular embodiment, the transition metals have a +1 or +2 oxidation state. In a very particular embodiment, the transition metals are selected from nickel, manganese, cobalt, copper, ruthenium and combinations thereof.

Although not wishing to be bound to any particular theory, it is thought that the atomic layer deposition process occurs via the physical adsorption of the precursors to a substrate surface. It is also thought that the planar structure of the ligand allows for an open site on the metal center to interact with the surface. The flowing of a reduction gas then removes the ligand.

Also, as briefly discussed above, a second atomic layer of elemental metal may optionally be formed added on the first atomic layer by repeating the process of the reaction cycle. Hydrogen remaining from the preceding reduction reaction is purged from the deposition chamber using an inert gas and a metal coordination complex in vapor phase is again flowed into the chamber into contact with the metal film on the substrate surface. An exchange reaction occurs between the metal coordination complex in the vapor phase and hydrogen atoms on the metal of the first atomic layer. This displaces one of the ligands from the vapor phase metal coordination complex and leaves the metal atom of the metal coordination complex bound to the metal atom of the first atomic layer. The reaction time, temperature and pressure are selected to create a metal-surface interaction and form a layer on the surface of the substrate. Unreacted vapor phase metal coordination complex and released ligand are purged from the deposition chamber using an insert gas. A reducing gas is then flowed into the deposition chamber to reduce the bond(s) between the metal and any remaining ligand(s), releasing the remaining ligand(s) from the metal center and producing a second atomic layer of elemental metal on the first atomic layer of elemental metal.

In one embodiment, a second layer of metal may be added by contacting the first layer of elemental metal on the substrate surface with the vapor phrase metal coordination complex such that an exchange reaction occurs between the metal complex and the first layer of elemental metal, thereby partially dissociating the metal complex and producing a second layer on the surface comprising the partially dissociated metal complex bound to the first elemental metal layer by the metal; and contacting the bound metal complex of the second layer with a reducing agent such that an exchange reaction occurs between the bound metal complex and the reducing agent, thereby dissociating the bound metal complex and producing a second layer of elemental metal on the surface of the substrate. Additional repetitions of the deposition cycle may be used to build a layer of elemental metal of the desired thickness.

In an alternative aspect of the ALD deposition methods of the invention, the substrate has a surface that is activated for reaction with the metal coordination complex to form a first layer on the substrate. A metal coordination complex according to the invention is vaporized and flowed in the vapor phase to a substrate within a deposition chamber. The metal atom becomes bound to the surface. The reaction time, temperature and pressure are selected to create a metal-surface interaction and achieve a layer on the surface of the substrate. The first layer comprises the metal bound to the surface and coordinated with at least one ligand. Following formation of the first monolayer, precursor gas containing unreacted metal coordination complex and released ligand are purged from the deposition chamber using an inert gas. A reducing agent is then flowed into the deposition chamber to reduce the remaining bond(s) between the metal and the ligand(s) of the coordination complex, releasing the remaining ligand(s) from the metal center and leaving an atomic layer of elemental metal on the substrate. The reducing agent may be of hydrogen gas, ammonia, hydrazines, $N_2$ plasma, $H_2$ plasma, Ar plasma ammonia plasma and combinations thereof. In a specific embodiment, the reducing agent is a gas comprising hydrogen.

As in the adsorption ALD process discussed above, a second atomic layer of elemental metal may optionally be formed on the first atomic layer by repeating the process of the reaction cycle. Hydrogen remaining from the preceding reduction reaction is purged from the deposition chamber using an inert gas and a metal coordination complex in vapor phase is again flowed into the chamber into contact with the metal film on the substrate surface. An exchange reaction occurs between the metal coordination complex in the vapor phase and hydrogen atoms on the metal of the first atomic layer. This displaces one of the ligands from the vapor phase metal coordination complex, reducing the displaced ligand and leaving the metal atom of the metal coordination complex bound to the metal atom of the first atomic layer. The reaction time, temperature and pressure are selected to achieve a uniform layer on the surface of the substrate. Unreacted vapor phase metal coordination complex and released ligands are purged from the deposition chamber using an insert gas. A reducing agent is flowed into the deposition chamber to reduce the bond(s) between the metal and any remaining ligand(s), releasing the remaining ligand(s) from the metal center and producing a second uniform atomic layer of elemental metal on the first atomic layer of elemental metal. Additional repetitions of the deposition cycle may be used to build a layer of elemental metal of the desired thickness.

The substrate for deposition of the elemental thin layer films may be any substrate suitable for conformal film coating in an ALD or CVD process. Such substrates include silicon, silica or coated silicon, metal, metal oxide and metal nitride. In one aspect of the invention, the substrate is a semiconductor substrate.

The reaction conditions for the ALD reaction will be selected based on the properties of the selected metal coordination complex. The deposition can be carried out at atmospheric pressure but is more commonly carried out at a reduced pressure. The vapor pressure of the metal coordination complex should be low enough to be practical in such applications. The substrate temperature should be low enough to keep the bonds between the metal atoms at the surface intact and to prevent thermal decomposition of gaseous reactants. However, the substrate temperature should also be high enough to keep the source materials (i.e., the reactants) in the gaseous phase and to provide sufficient activation energy for the surface reaction. The appropriate temperature depends on the specific metal coordination complex used and the pressure. The properties of a specific metal coordination complex for use in the ALD deposition methods of the invention can be evaluated using methods known in the art, allowing selection of appropriate temperature and pressure for the reaction. In general, lower molecular weight and the presence of functional groups that increase the rotational entropy of the ligand sphere result in a melting point that yields liquids at typical delivery temperatures and increased vapor pressure.

An optimized metal coordination complex with a structure of formulas (I) through (VI) for use in the deposition methods of the invention will have all of the requirements for sufficient vapor pressure, sufficient thermal stability at the selected substrate temperature and sufficient reactivity to produce a self-limiting reaction on the surface of the substrate without unwanted impurities in the thin film or condensation. Sufficient vapor pressure ensures that molecules of the source compound are present at the substrate surface in sufficient concentration to enable a complete self-saturating reaction. Sufficient thermal stability ensures that the source compound will not be subject to the thermal decomposition which produces impurities in the thin film.

Another aspect of the invention pertains to an apparatus for deposition of a film on a substrate to perform a process according to any of the embodiments described above. In one embodiment, the apparatus comprises a deposition chamber for atomic layer deposition of a film on a substrate. The chamber comprises a process area for supporting a substrate. The apparatus includes a precursor inlet in fluid communication with a supply of an elemental metal precursor. The apparatus also includes a reactant gas inlet in fluid communication with a supply of a reducing agent, as discussed above. The apparatus further includes a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of depositing elemental metal by atomic layer deposition, the method comprising:
   contacting a surface of a substrate with a vapor phase metal coordination complex wherein the metal coordination complex has a structure represented by:

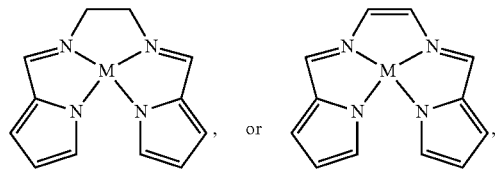

wherein M is a transition metal, such that a layer is formed on the surface comprising the metal coordination complex bound to the surface by the metal; and
   contacting the bound metal complex with a reducing gas such that an exchange reaction occurs between the bound metal coordination complex and the reducing gas, thereby dissociating the bound metal complex and producing a first layer of elemental metal on the surface of the substrate.

2. The method of claim 1, wherein M comprises nickel, manganese, cobalt, copper, ruthenium or combinations thereof.

3. The method of claim 1, wherein the reducing gas comprises hydrogen.

4. The method of claim 1, further comprising purging excess unreacted vapor phase metal complex with an inert gas prior to addition of the reducing gas.

5. The method of claim 1, the method further comprising:
   contacting the first layer of elemental metal on the substrate surface with the vapor phrase metal coordination complex such that an exchange reaction occurs between the metal complex and the first layer of elemental metal, thereby partially dissociating the metal complex and producing a second layer on the surface comprising the partially dissociated metal complex bound to the first elemental metal layer by metal; and
   contacting the bound metal complex of the second layer with a reducing gas such that an exchange reaction occurs between the bound metal complex and the reducing gas, thereby dissociating the bound metal complex and producing a second layer of elemental metal on the surface of the substrate.

* * * * *